United States Patent
Okuyama

(10) Patent No.: US 9,679,937 B2
(45) Date of Patent: Jun. 13, 2017

(54) SEMICONDUCTOR DEVICE AND METHOD FOR PRODUCTION OF SEMICONDUCTOR DEVICE

(71) Applicant: Sony Corporation, Tokyo (JP)

(72) Inventor: Atsushi Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/992,865

(22) Filed: Jan. 11, 2016

(65) Prior Publication Data

US 2016/0126279 A1 May 5, 2016

Related U.S. Application Data

(63) Continuation of application No. 14/270,104, filed on May 5, 2014, now Pat. No. 9,269,680, which is a
(Continued)

(30) Foreign Application Priority Data

Aug. 24, 2009 (JP) ................................ 2009-193324

(51) Int. Cl.
*H01L 23/00* (2006.01)
*H01L 27/146* (2006.01)
(Continued)

(52) U.S. Cl.
CPC .. *H01L 27/14636* (2013.01); *H01L 21/76804* (2013.01); *H01L 23/53238* (2013.01); *H01L 24/06* (2013.01); *H01L 24/09* (2013.01); *H01L 24/94* (2013.01); *H01L 25/50* (2013.01); *H01L 27/14634* (2013.01); *H01L 21/76831* (2013.01); *H01L 21/76898* (2013.01); *H01L 23/53214* (2013.01); *H01L 23/53228* (2013.01);
(Continued)

(58) Field of Classification Search
CPC ......... H01L 27/11536; H01L 21/76804; H01L 24/09; H01L 23/522; H01L 27/14636; H01L 23/53238
See application file for complete search history.

(56) References Cited

U.S. PATENT DOCUMENTS

| 7,723,851 B2 * | 5/2010 | La Tulipe, Jr. ... H01L 21/76802 257/758 |
| 2007/0013073 A1 * | 1/2007 | Cabral .............. H01L 21/76801 257/758 |

(Continued)

FOREIGN PATENT DOCUMENTS

| CN | 100334725 | 8/2007 |
| CN | 101499432 | 8/2009 |

(Continued)

OTHER PUBLICATIONS

Official Action (with English translation) for Korean Patent Application No. 10-2010-0078691 mailed Feb. 17, 2016, 13 pages.
(Continued)

*Primary Examiner* — Nathan W Ha
(74) *Attorney, Agent, or Firm* — Sheridan Ross P.C.

(57) ABSTRACT

A semiconductor device with a connection pad in a substrate, the connection pad having an exposed surface made of a metallic material that diffuses less readily into a dielectric layer than does a metal of a wiring layer connected thereto.

21 Claims, 7 Drawing Sheets

Related U.S. Application Data continuation of application No. 13/758,775, filed on Feb. 4, 2013, now Pat. No. 8,742,585, which is a continuation of application No. 12/858,052, filed on Aug. 17, 2010, now Pat. No. 8,368,222.

(51) Int. Cl.
*H01L 25/00* (2006.01)
*H01L 21/768* (2006.01)
*H01L 23/532* (2006.01)

(52) U.S. Cl.
CPC ............ *H01L 2224/0568* (2013.01); *H01L 2224/05547* (2013.01); *H01L 2224/05609* (2013.01); *H01L 2224/05611* (2013.01); *H01L 2224/05624* (2013.01); *H01L 2224/05639* (2013.01); *H01L 2224/05644* (2013.01); *H01L 2224/05655* (2013.01); *H01L 2224/05657* (2013.01); *H01L 2224/05666* (2013.01); *H01L 2224/05681* (2013.01); *H01L 2224/05684* (2013.01); *H01L 2224/0903* (2013.01); *H01L 2224/095* (2013.01); *H01L 2224/80357* (2013.01); *H01L 2224/80895* (2013.01); *H01L 2224/80896* (2013.01); *H01L 2225/06513* (2013.01); *H01L 2924/01002* (2013.01); *H01L 2924/01004* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01018* (2013.01); *H01L 2924/01022* (2013.01); *H01L 2924/01023* (2013.01); *H01L 2924/01027* (2013.01); *H01L 2924/01028* (2013.01); *H01L 2924/01029* (2013.01); *H01L 2924/01033* (2013.01); *H01L 2924/01042* (2013.01); *H01L 2924/01047* (2013.01); *H01L 2924/01049* (2013.01); *H01L 2924/01073* (2013.01); *H01L 2924/01074* (2013.01); *H01L 2924/01079* (2013.01); *H01L 2924/01082* (2013.01); *H01L 2924/04953* (2013.01)

(56) References Cited

U.S. PATENT DOCUMENTS

| 2008/0023838 | A1* | 1/2008 | Sakata | H01L 21/2855 257/758 |
| 2008/0197502 | A1* | 8/2008 | Kikuchi | H01L 21/2885 257/758 |
| 2009/0137111 | A1* | 5/2009 | Lee | H01L 21/76814 438/618 |

FOREIGN PATENT DOCUMENTS

| JP | 2001-210779 | 8/2001 |
| JP | 2008-182283 | 8/2008 |
| KR | 10-2005-0009235 | 1/2005 |
| KR | 10-2007-0093834 | 9/2007 |
| TW | 200843080 | 11/2008 |

OTHER PUBLICATIONS

Official Action (with English translation) for Korean Patent Application No. 10-2016-0088496 mailed Sep. 23, 2016, 15 pages.
Official Action (with English translation) for Chinese Patent Application No. 201410686327.9 dated Nov. 22, 2016, 25 pages.

\* cited by examiner

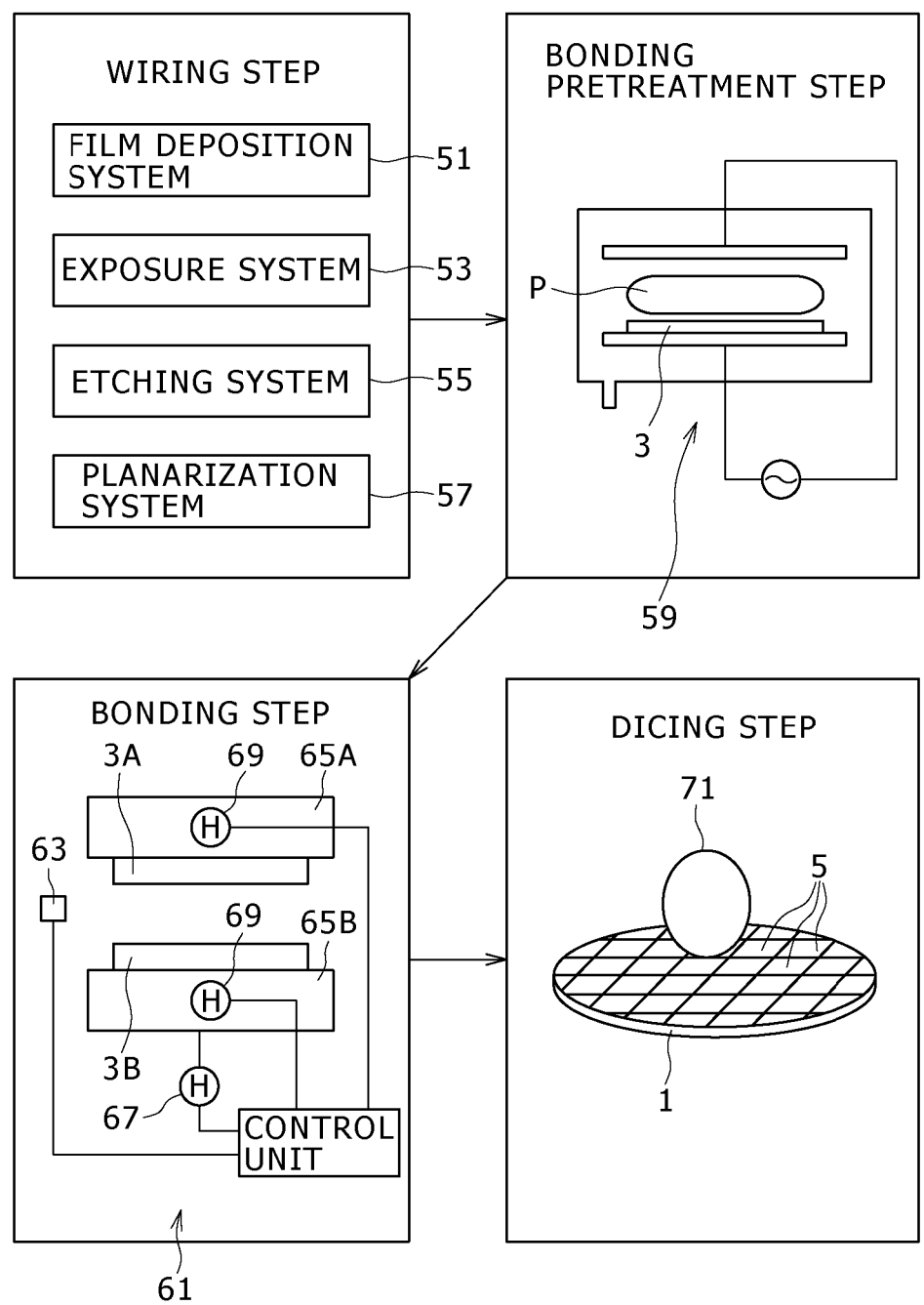

SEMICONDUCTOR DEVICE AND METHOD FOR PRODUCTION OF SEMICONDUCTOR DEVICE

CROSS-REFERENCE TO RELATED APPLICATIONS

This application is a continuation of U.S. patent application Ser. No. 14/270,104, filed May 5, 2014, which is a continuation of U.S. patent application Ser. No. 13/758,775, filed Feb. 4, 2013, now U.S. Pat. No. 8,742,585, which is a continuation of U.S. patent application Ser. Ser. No. 12/858,052, filed Aug. 17, 2010, now U.S. Pat. No. 8,368,222, which claims priority to Japanese Patent Application Serial No. JP 2009-193324, filed in the Japan Patent Office on Aug. 24, 2009, the entire disclosure of which are hereby incorporated herein by reference.

BACKGROUND OF THE INVENTION

The present invention relates to a semiconductor device and a method for producing a semiconductor device.

There is known a technique for bonding together two semiconductor substrates for producing highly integrated semiconductor chips. (See Japanese Patent Laid-open No. 2006-66808, hereinafter referred to as Patent Document 1, for example.) According to Patent Document 1, the two semiconductor substrates bonded together are electrically connected to each other through a bump held between them.

SUMMARY OF THE INVENTION

Disclosed herein are one or more inventions that provide one or more ways to minimize or eliminate diffusion of material from a contact pad into a facing substrate or a contact pad on the facing substrate.

According to an embodiment of the present invention, each of two semiconductor substrates is provided with a pad, and the two pads are connected to each other through their direct contact with each other.

Embodiments of the present invention obviate the deterioration of the electrical properties of bonded semiconductor substrates due to relative displacement of one pad and/or substrate relative to the other pad and/or substrate. Such displacement can cause the pad on one semiconductor substrate to come into contact with a dielectric film of the other semiconductor substrate. In this state, ions of the metal constituting the pad may diffuse into the dielectric film, thereby degrading electrical properties.

Embodiments of the present invention provide semiconductor devices and methods for the production thereof.

The semiconductor device, according to an embodiment of the present invention, includes a substrate, a dielectric layer, a pad, and a wiring. The dielectric layer is formed on one side of the substrate. A pad is formed within a groove of the dielectric layer. The wiring is connected to the pad. At least a region at an exposed top surface of the pad is made of a metallic material that is less diffusible into an insulating layer than is the wiring. The insulating layer may be formed on another substrate such that it is adjacent to the dielectric layer in which the pad is contained.

According to another embodiment, a semiconductor device includes a first semiconductor substrate and a second semiconductor substrate. A first dielectric film is formed on a surface of the first semiconductor substrate. A first pad is formed on the first substrate. A second dielectric film is formed on a surface of the second semiconductor substrate. A second pad is formed on the second substrate. A wiring is electrically connected to the second pad. The first and second pads have exposed contacting regions. The first substrate and the second substrate are bonded together such that the contacting region of the first pad is electrically connected to the contacting region of the second pad. At least the contacting region of the second pad is formed of a metallic material that is less diffusible into the first dielectric film than is the wiring.

According to an embodiment of the present invention, a method for producing a semiconductor device includes forming a first pad and a second pad. The first pad is formed within a groove of a first dielectric film on a first substrate. The second pad is formed within a groove of a second dielectric film on a second substrate. The method includes bonding the first and second substrates together such that a contacting region of the first pad engages against a contacting region of the second pad. At least the contacting region of the second pad is formed of a metallic material that is less diffusible into the first dielectric film than is the wiring.

According to the embodiments of the present disclosure, it is possible to prevent the semiconductor device from deteriorating in electrical properties due to a displacement of semiconductor substrates, which may occur at the time of bonding.

BRIEF DESCRIPTION OF THE DRAWINGS

FIG. 3 is a schematic diagram illustrating the method for production of chips to be fabricated from laminated wafers shown in FIG. 1;

DETAILED DESCRIPTION OF THE PRESENTLY PREFERRED EMBODIMENTS

Figure 1A:
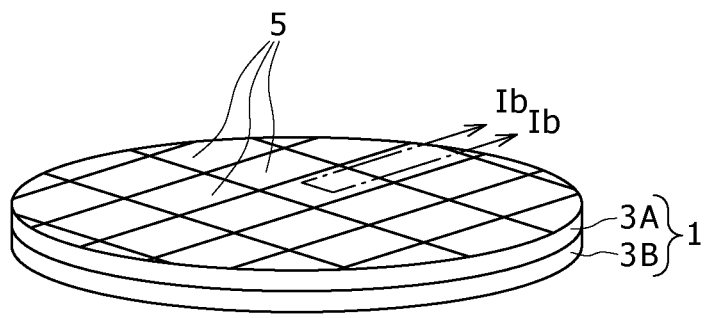
FIGS. 1A and 1B are a schematic perspective view and a schematic sectional view, respectively, showing the laminated wafer pertaining to one embodiment of the present invention.

FIG. 1A is a schematic perspective view showing the laminated wafer 1 pertaining to one embodiment of the present invention.

The laminated wafer 1 is composed of the first wafer 3A and the second wafer 3B which are bonded together. (These wafers will be simply referred to a "wafer 3" without discrimination in some cases hereinafter.) The laminated wafer 1 is divided into a plurality of chips (semiconductor device 5) by dicing.

Figure 1B:
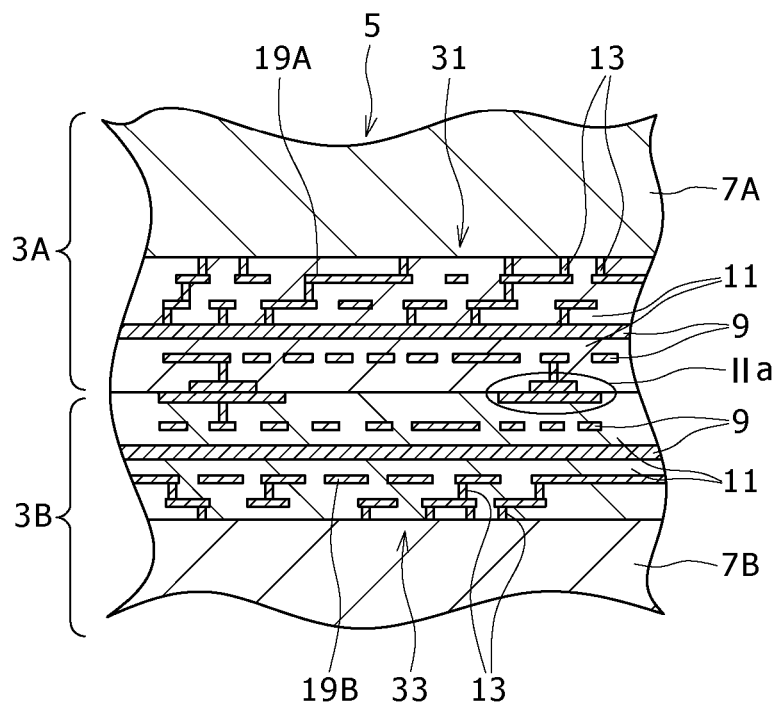

FIG. 1B is a schematic sectional view taken along the line Ib to Ib in FIG. 1A.

The first wafer 3A is composed of the first semiconductor substrate 7A and the multiple layers laminated thereon which are the wiring layers 9 and the interlayer dielectric films 11. Incidentally, FIG. 1B does not show the boundary line between the multiple layers, which may constitute an interlayer dielectric film 11. Like the first wafer 3A, the second wafer 3B is also composed of the second semiconductor substrate 7B and the multiple layers laminated thereon which are the wiring layers 9 and the interlayer dielectric films 11. In the first and second wafers 3A and 3B, the multiple wiring layers 9 are connected to one another through the vias 13 penetrating the interlayer dielectric films 11.

Incidentally, the term "semiconductor substrate 7" will be occasionally used hereinafter to denote both the first semiconductor substrate 7A and the second semiconductor substrate 7B without discrimination between them.

The semiconductor substrate 7 is an unfabricated wafer (or wafer in a narrow sense), which is formed from silicon, for instance. The wiring layers 9 and the vias 13 are formed from copper, for instance. The interlayer dielectric films 11 are formed from any material containing at least one of silicon, nitrogen, oxygen, and carbon. Their examples include silicon oxide film.

The wiring layers 9 and the vias 13 in the wafers 3A and 3B have the barrier metal 21 which prevents their diffusion into the interlayer dielectric film 11. See FIG. 2A. The barrier metal 21 may be formed from materials, such as TiN or TaN, for instance.

Incidentally, the semiconductor substrate 7 and the interlayer dielectric film 11 will be referred by the same name or symbol for brevity hereinafter both before dicing and after dicing.

Each of the wafers 3A and 3B will be made into a monofunctional LSI by fabrication of semiconductor elements (not shown), the wiring layers 9, and the vias 13 on the semiconductor substrate 7. For example, the monofunctional LSI on the wafer 3A and the wafer 3B may be the memory 31 and the logic device 33, respectively. The memory 31 may be DRAM, SRAM, and flash memory, for instance, and the logic device 33 may be MPU and peripheral circuit, for instance. If the wafers 3A and 3B each having the monofunctional LSI are bonded together, it will be possible to produce an LSI chip with multiple functions and a high degree of integration.

Figure 2A:
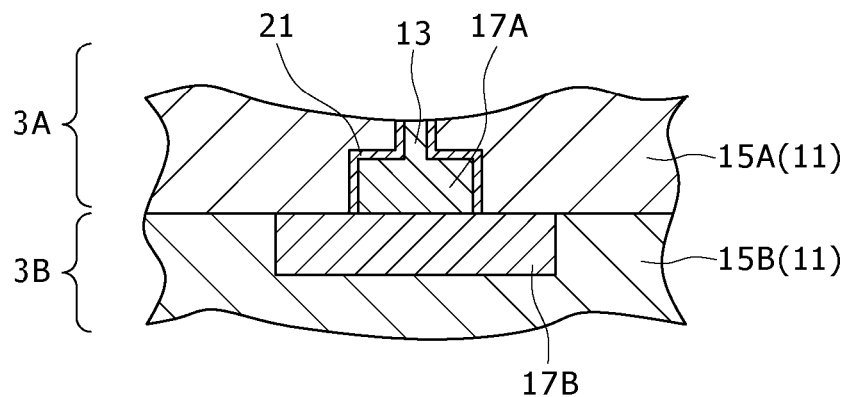
FIG. 2A is a sectional view of the region IIa in FIG. 1B, and FIGS. 2B and 2C are plan views of the region IIa in FIG. 1B.
Figure 2B:
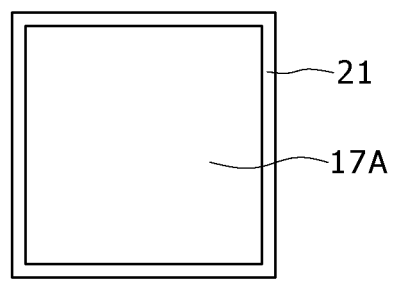
Figure 2C:
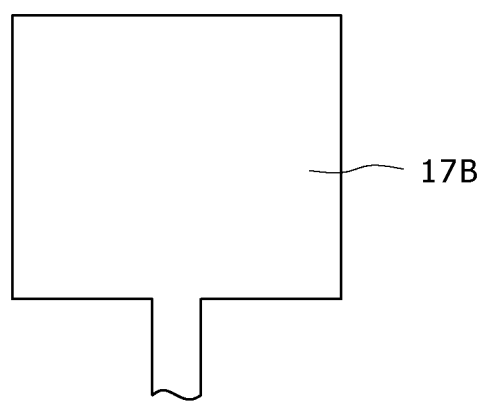

FIG. 2A is an enlarged view of the region IIa shown in FIG. 1B. FIG. 2B is a plan view (seen from the second wafer 3B) of the first wafer 3A in the region IIa shown in FIG. 2A. FIG. 2C is a plan view (seen from the first wafer 3A) of the second wafer 3B in the region IIa shown in FIG. 2A.

The two wafers 3A and 3B form an integral body, with the interlayer dielectric films 11 (as the uppermost layers) bonded to each other. Incidentally, terms "the first dielectric film 15A" and "the second dielectric film 15B" will be used hereinafter to denote respectively the uppermost interlayer dielectric film 11 of the first wafer 3A and the uppermost interlayer dielectric film 11 of the second wafer 3B. Also, a term "the dielectric film 15" will be used occasionally hereinafter to simply denote both "the first dielectric film 15A" and "the second dielectric film 15B" without discrimination between them.

Also, the two wafers 3A and 3B are electrically connected to each other through the first pad 17A (in the first wafer 3A) and the second pad 17B (in the second wafer 3B) which are in contact with each other. Incidentally, the first pad 17A and the second pad 17B will be simply referred to as the "pad 17" hereinafter without discrimination between them.

The first pad 17A is formed from metal filled into the recess (groove) formed in the first dielectric film 15A. The first pad 17A has an exposed face which is flush with the boundary between the first dielectric film 15A and the second dielectric film 15B. The first pad 17A has a rectangular shape in plan view, for instance.

The first pad 17A is connected to the via 13 formed right above it. In this way the first pad 17A is connected to the first wiring conductor 19A shown in FIG. 1B, which is composed of the wiring layer 9 and the via 13 and is covered with the first dielectric layer 15A (and other interlayer dielectric film 11).

The second pad 17B is also formed from metal filled into the recess (groove) formed in the second dielectric film 15B. The second pad 17B has an exposed face which is flush with the boundary between the first dielectric film 15A and the second dielectric film 15B. The second pad 17B has a rectangular shape in plan view, for instance.

The second pad 17B is formed from a metal which is less diffusible into the interlayer dielectric film 11 than copper. Such a metal includes, for example, Au, Ag, Al, Ta, Ti, W, Sn, Mo, Ni, In and Co and an alloy containing at least one of them.

The second pad 17B is connected to the second wiring conductor 19B shown in FIG. 1B, which is composed of the wiring layer 9 and the via 13 and is covered with the second dielectric layer 15B.

The first and second wiring conductors 19A and 19B may be simply referred to as "the wiring conductor 19" hereinafter without discrimination between them.

The second pad 17B is formed wider than the first pad 17A. In other words, the two pads 17 are formed in such a way that the first pad 17A remains covered by the second pad 17B even though they get out of the position when the two wafers 3 are bonded together.

Misalignment at the time of bonding is about ±3 μm, for instance. Therefore, the second pad 17B should be larger than the first pad 17A by 6 μm or more.

The result of the two pads 17 being formed as mentioned above is that only the second pad 17B comes into contact with the dielectric film 15 in case of misalignment at the time of bonding. The second pad 17B is less diffusible into the dielectric film 15 than the first pad 17A.

Incidentally, the first pad 17A may be connected to the first wiring conductor 19A through the connecting part in the same way as the second pad 17B. In this case, the connecting part 18 for the second pad 17B should be larger than the connecting part for the first pad 17A by more than the amount of misalignment.

The second pad 17B may have the via 13 right below it in the same way the first pad 17A, so that it is connected to the second wiring conductor 19B.

FIG. 3 is a conceptual diagram illustrating the process for producing the chip 5.

The wiring step forms by repeated photolithography the interlayer dielectric film 11 (in multiple layers), the wiring layer 9 (in multiple layers), the wiring conductor 19, and the pad 17. The wiring step employs the film deposition system 51, the exposure system 53, the etching system 55, and the planarization system 57.

In the wiring step, the pad 17 is formed by damascene process (either single damascene process or dual damascene process). FIG. 2A shows the first pad 17A which was formed by dual damascene process.

Each of the wafers 3 undergoes the bonding pretreatment step, which involves activation of the surface of the wafer 3 and removal of oxide film from the pad 17. This step is accomplished by reduction or annealing. Reduction employs hydrogen plasma, $NH_3$ plasma, or formic acid plasma. Annealing employs hydrogen or forming gas ($N_2$ or $H_2$).

Incidentally, FIG. 3 schematically shows the volumetric plasma reduction treatment system 59, which is run under the following conditions.

Gas: $H_2/Ar=100/170$ sccm
Microwave: 2.8 kW (2.45 GHz)
Pressure: 0.4 Pa
Substrate temperature: 400° C.
Duration: 1 min The pretreatment step is followed by the bonding step in which the pretreated wafers 3 are bonded together by the bonding system 61, such as any bonding system that is effective to bond an interposer to the semiconductor substrate.

The bonding system 61 has the function to position the two wafers 3 and the function to bond them together with heating under pressure.

The positioning is accomplished by causing the wafer's notch or orientation flat to engage with a relevant engaging member, or by causing the wafer 3 to fit into a relevant positioning member (such as a V-shaped frame), or by detecting the notch, orientation flat, and/or entire edge and properly moving the wafer 3 according to the results of detection.

FIG. 3 shows an example of the equipment which has the detector 63 to detect the notch of the second wafer 3B, the second table 65B supporting the second wafer 3B, and the drive unit 67 to achieve positioning by translational or rotational movement of the second wafer 3B according to the results of detection.

The positioning unit may be combined with or separated from the heating and pressurizing unit. In the case of the equipment shown in FIG. 3, each of the first and second tables 65A and 65B, which are intended for positioning, is provided with the heater 69 and the first and second tables 65A and 65B apply heat and pressure.

The bonding equipment (or the positioning unit in the bonding equipment) varies in positioning accuracy depending on the principle of positioning, the tolerance of the members, and the accuracy of the constituents of the equipment. In the wiring step mentioned above, the second pad 17B is formed in such a way that it is larger than the first pad 17A by more than the accuracy of positioning by the bonding equipment 61.

Incidentally, the accuracy of positioning may be based on experimental values available from the producer of the bonding equipment or obtained by the user of the bonding equipment.

Thus the two wafers 3 are bonded together, and the resulting laminated wafer 1 undergoes dicing by the dicing blade 71, so that it is divided into a plurality of chips 5.

According to the foregoing embodiment, the resulting chip 5 is composed of the first semiconductor substrate 7A and the second semiconductor substrate 7B, both facing each other. In addition, the chip 5 has the first wiring conductor 19A formed in the first semiconductor substrate 7A and the second wiring conductor 19B formed in the second semiconductor substrate 7B. The chip 5 also has the first dielectric film 15A, which covers the first wiring conductor 19A, and the second dielectric film 15B, which covers the second wiring conductor 19B and faces the first dielectric film 15A bonded thereto. The chip 5 also has the first pad 17A, which is connected to the first wiring conductor 19A and faces toward the second pad 17B. The chip 5 also has the second pad 17B, which is connected to the second wiring conductor 19B and faces toward the first pad 17A bonded thereto. The second pad 17B is formed from a metal which is less diffusible into the first dielectric film 15A than the second wiring conductor 19B.

The method for producing the chip 5 includes a step of forming the first pad 17A in the first semiconductor substrate 7A which has the first wiring conductor 19A formed therein and the first dielectric film 15A formed therein which covers the first wiring conductor 19A. The first pad 17A is connected to the first wiring conductor 19A and exposes itself from the first dielectric film 15A. The method for producing the chip 5 also includes a step of forming the second pad 17B in the second semiconductor substrate 7B which has the second wiring conductor 19B formed therein and the second dielectric film 15B formed therein which covers the second wiring conductor 19B. The second pad 17B is connected to the second wiring conductor 19B and exposes itself from the second dielectric film 15B. Moreover, the method for producing the chip 5 includes a step of bonding together the first semiconductor substrate 7A and the second semiconductor substrate 7B, with the first pad 17A and the second pad 17B kept in contact with each other. Then, the second pad 17B is formed from a metal which is less diffusible into the first dielectric film 15A than the second wiring conductor 19B.

Therefore, even though misalignment occurs at the time of positioning for bonding and the second pad 17B comes into contact with the first dielectric film 15A, metal diffusion into the first dielectric film 15A is less significant than in the case where the second pad 17B is formed from the metal constituting the second wiring conductor 19B. Although any metal less diffusible into the dielectric film is usually expensive, such a metal is not used for the entire wiring but is used only for the second pad 17B according to an embodiment of the present invention. This contributes to cost reduction and protection of the second pad 17B from oxidation.

Since the second pad 17B is wider than the first pad 17A, the first pad 17A does not come into contact with the second dielectric film 15B even in the case of positioning misalignment. As the result, if either of the first pad 17A and the second pad 17B is formed from a metal less diffusible into the dielectric film 15, it is possible to prevent metal from diffusing into the dielectric film 15 due to positioning misalignment. Consequently, the first pad 17A can be formed from a metal (such as the same one as used for the first wiring conductor 19A) which is as diffusible into the second dielectric film 15B as the first wiring conductor 19A into the second dielectric film 15B. The first pad 17A can also be formed from a metal which is more diffusible into the second dielectric film 15B than the second pad 17B is diffusible into the first dielectric film 15A.

The low-diffusible metal includes Au, Ag, Al, Ta, Ti, W, Sn, Mo, Ni, In and Co and an alloy containing at least any one of them. These metals are not only less diffusible than copper constituting the wiring conductor 19 but also better in bonding performance than other low-diffusible metals (such as Al and W).

Bonding of the wafers 3A and 3B or bonding of the first and second semiconductor substrates 7A and 7B is accomplished by using the bonding equipment 61 capable of accurate positioning. Moreover, the second pad 17B is wider than the first pad 17A by more than the positioning accuracy. These measures effectively prevent metal diffusion due to positioning errors.

First Modified Example

Figure 4:
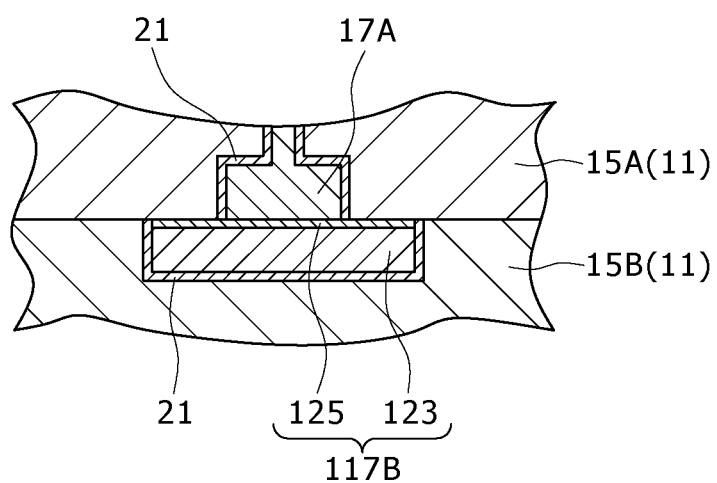
FIG. 4 is a sectional view showing a first modification of the embodiment shown in FIG. 2A.

FIG. 4 is a sectional view showing a first modification of the embodiment shown in FIG. 2A.

According to the embodiment of FIG. 2A, the second pad 17B is formed entirely from a low-diffusible metal. By contrast, according to a first modified embodiment, the second pad 117B has a surface layer which is formed from a low-diffusible metal.

In other words, the second pad 117B has the base part 123, which accounts for a large portion (by volume) thereof, and the base part 123 is formed from the same material (such as copper) as the second wiring conductor 19B. The second pad 117B also has the covering layer 125 which is formed on that side of the base part 123 which faces the first pad 17A. The covering layer 125 is formed from a low-diffusible metal (such as Au).

The structure mentioned above saves expensive low-diffusible metal and contributes to cost reduction.

Second Modified Example

Figure 5:
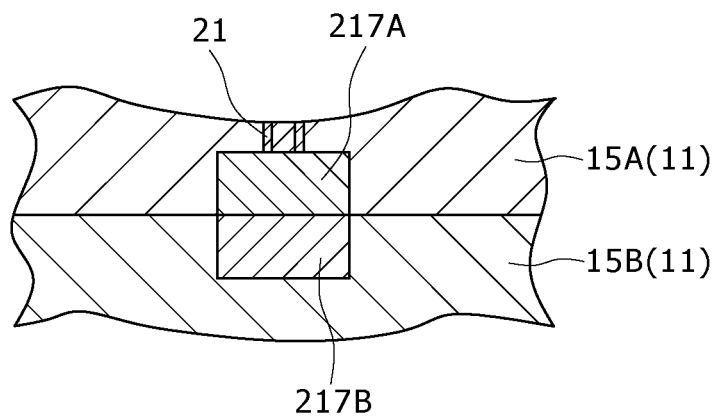
FIG. 5 is a sectional view showing a second modification of the embodiment shown in FIG. 2A.

FIG. 5 is a sectional view showing a second modification of the embodiment shown in FIG. 2A.

According to the embodiment of FIG. 2A, either of the first pad 17A or the second pad 17B is formed from a low-diffusible metal. By contrast, according to a second modified embodiment, both of the first pad 217A and the second pad 217B are formed from a low-diffusible metal.

This structure prevents metal from diffusing into the dielectric film 15 even when either of the two pads 217 comes into contact with the dielectric film 15. In other words, this structure prevents metal diffusion from either of the pads 217 even though one of the two pads 217 is not made wider than the other despite the possibility of positioning errors. This permits the design with a high degree of freedom for dimensions. FIG. 5 shows an instance in which the first pad 217A and the second pad 217B have the same area.

Third Modified Example

Figure 6:
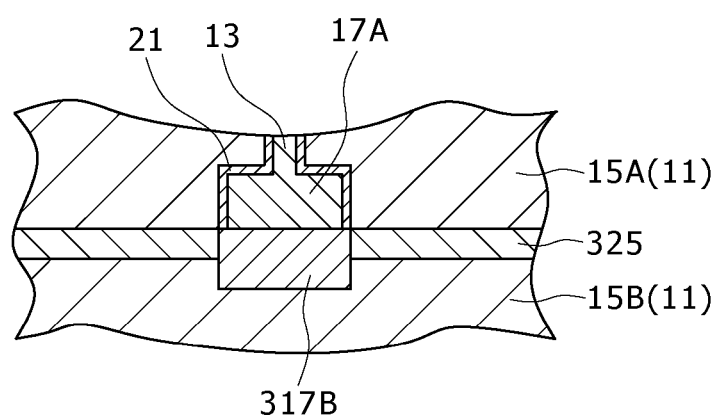
FIG. 6 is a sectional view showing a third modification of the embodiment shown in FIG. 2A.

FIG. 6 is a sectional view showing a third modification of the embodiment shown in FIG. 2A.

According to this modified embodiment, the second dielectric film 15B has the diffusion preventing layer 325 formed thereon which prevents the metal of the first pad 17A from diffusing into the second dielectric film 15B. The diffusion preventing layer 325 may be formed from SiN or SiOC, for instance. Incidentally, the second pad 317B exposes itself toward the first dielectric film 15A through the diffusion preventing layer 325.

In this case, metal diffusion from the first pad 17A is inhibited by the diffusion preventing layer 325. Therefore, as in the case of the second modified embodiment, it is possible to prevent metal from diffusing from the first pad 17A without expanding the second pad 317B. This permits the design with a high degree of freedom for dimensions. FIG. 6 shows an instance in which the first pad 17A and the second pad 317B have the same area.

Fourth Modified Example

Figure 7A:
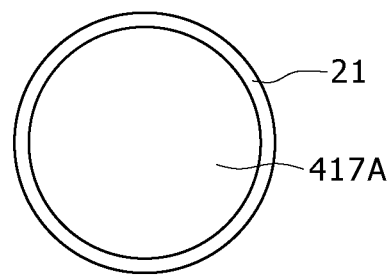
FIGS. 7A and 7B are plan views showing a fourth modification of the embodiments shown in FIGS. 2B and 2C, respectively.
Figure 7B:
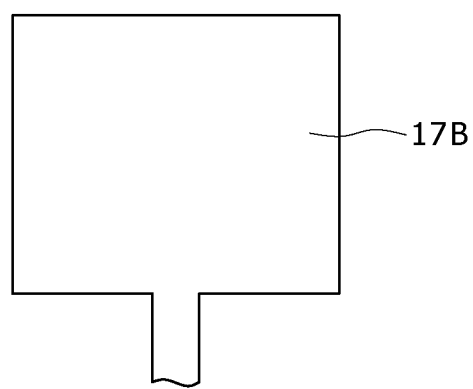

FIGS. 7A and 7B are plan views showing a fourth modification of the embodiment shown in FIGS. 2B and 2C.

According to this modified embodiment, the first pad 417A has a round shape. In this case, the first pad 417A overreaches the second pad 17B a little even though its position deviates by rotation about the axis perpendicular to it. The result is positive inhibition of metal diffusion.

The scope of the present invention is not limited to the embodiments mentioned above. It covers other various embodiments.

Figure 8A:
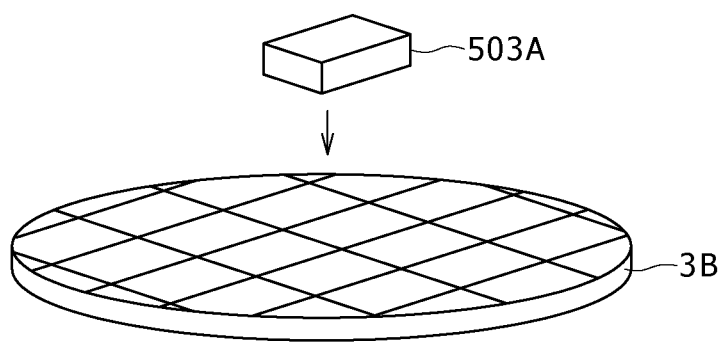
FIGS. 8A and 8B are schematic perspective views showing an example of chips bonded together.
Figure 8B:
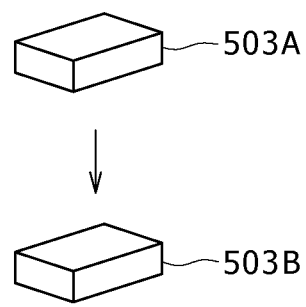

The foregoing embodiments demonstrate the bonding of wafers to each other. The present invention may be applied to another embodiment, as shown in FIG. 8A, in which the chip 503A is bonded to the wafer 3B or the chips 503A and 503B are bonded together.

Incidentally, the chip-to-wafer bonding will involve a larger positioning misalignment than the wafer-to-wafer bonding. The accuracy of alignment will be larger than ±10 µm in the former case, whereas it will be about ±3 µm. in the latter case. This difference should be taken into account when the area of the pad is designed.

The scope of the present invention is not limited to bonding two wafers (or chips) together. For example, the scope may cover the bonding of three or more wafers together. Each wafer (or chip) may include any type of circuit and is not limited to memory or logic devices. For example, the circuit may be for an imaging device.

The embodiments or modifications thereof disclosed herein may be properly combined with one another. For example, the technology shown in FIG. 4 (in which a low-diffusible metal is used only for the surface of the pad) may be combined with the technology shown in FIG. 5 (in which a low-diffusible metal is used only for the surfaces of the two pads).

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
   a first semiconductor substrate including:
      a first interlayer dielectric film,
      a first wiring layer,
      an imaging device,
      a first pad formed at least partially within the first interlayer dielectric film, and
      a barrier layer formed between the first pad and the first interlayer dielectric film; and
   a second semiconductor substrate including:
      a second interlayer dielectric film,
      a second wiring layer, and
      a second pad formed at least partially within the second interlayer dielectric film such that a portion of the second semiconductor substrate is between a bottommost surface of the second pad and a surface of the second semiconductor substrate;
   wherein,
      the second semiconductor substrate further includes at least one of a logic device or a memory device,
      one of the first pad or the second pad includes copper, and
      the other of the first pad or the second pad includes at least one metallic material including Au, Ag, Al, Ta, Ti, W, Sn, Mo, Ni, In, Co, or an alloy of any of them.
2. The semiconductor device of claim 1, wherein the barrier layer includes TiN or TaN.
3. The semiconductor device of claim 1, wherein at least a portion of the barrier layer is in contact with at least a portion of the second pad.
4. The semiconductor device of claim 1, wherein the first semiconductor substrate is bonded to the second semiconductor substrate.

5. The semiconductor device of claim 4, wherein the first and second pads are in contact with one another.

6. The semiconductor device of claim 5, wherein the second pad is formed from a metallic material that is less diffusible into the second interlayer dielectric film than the second wiring layer.

7. The semiconductor device of claim 1, wherein the first pad has a surface exposed to and facing the second substrate, and wherein the second pad has a surface exposed to and facing the first substrate.

8. The semiconductor device of claim 7, wherein the exposed surface of the second pad is larger than the exposed surface of the first pad.

9. The semiconductor device of claim 1, wherein the second pad includes a base portion and a covering layer.

10. The semiconductor device of claim 1, wherein the first pad is formed in a recess portion of the first interlayer dielectric film.

11. The semiconductor device of claim 10, wherein the second pad is formed in a recess portion of the second interlayer dielectric film.

12. The semiconductor device of claim 11, wherein the first pad has an exposed face that is flush with a boundary between the first interlayer dielectric film and the second interlayer dielectric film, wherein the second pad has an exposed face that is flush with the boundary between the first interlayer dielectric film and the second interlayer dielectric film, and wherein the exposed face of the second pad is larger than the exposed face of the first pad.

13. The semiconductor device of claim 1, wherein the first pad includes copper.

14. The semiconductor device of claim 1, wherein the barrier layer is effective to prevent metal of the first pad from diffusing into the first interlayer dielectric film.

15. The semiconductor device of claim 1, wherein the second semiconductor substrate further includes a barrier layer formed between the second pad and the second interlayer dielectric film.

16. The semiconductor device of claim 1, further comprising:
a diffusion preventing layer formed on the second interlayer dielectric film.

17. The semiconductor device of claim 16, wherein the second pad is exposed through the diffusion preventing layer.

18. The semiconductor device of claim 17, wherein the diffusion preventing layer is effective to prevent metal of the second pad from diffusing into the second interlayer dielectric film.

19. The semiconductor device of claim 1, wherein a contacting region of the second pad is substantially equivalent in size to a contacting region of the first pad.

20. A semiconductor device comprising:
a first semiconductor substrate including an image device;
a first interlayer dielectric film and a first wiring layer provided at a first side of the first semiconductor substrate;
a first pad formed at least partially within the first interlayer dielectric film;
a barrier layer between the first pad and the first interlayer dielectric film;
a second semiconductor substrate including at least one of a logic device or a memory device;
a second interlayer dielectric film and a second wiring layer provided at a first side of the second semiconductor substrate;
a second pad formed at least partially within the second interlayer dielectric film such that a portion of the second semiconductor substrate is between a bottommost surface of the second pad and a surface of the second semiconductor substrate;
wherein,
one of the first pad or the second pad includes copper, and
the other of the first pad or the second pad includes at least one metallic material including Au, Ag, Al, Ta, Ti, W, Sn, Mo, Ni, In, Co, or an alloy of any of them.

21. A semiconductor device comprising:
a first semiconductor wafer including an imaging device, the first semiconductor wafer further including:
a first semiconductor substrate,
a first interlayer dielectric film and a first wiring layer provided at a first side of the first semiconductor substrate,
a first pad formed at least partially within the first interlayer dielectric film, and
a barrier layer between the first pad and the first interlayer dielectric film; and
a second semiconductor wafer including at least one of a logic device or a memory device, the second semiconductor wafer further including:
a second semiconductor substrate,
a second interlayer dielectric film and a second wiring layer provided at a first side of the second semiconductor substrate, and
a second pad formed at least partially within the second interlayer dielectric film such that a portion of the second semiconductor substrate is between a bottommost surface of the second pad and a surface of the second semiconductor substrate,
wherein,
one of the first pad or the second pad includes copper, and
the other of the first pad or the second pad includes at least one metallic material including Au, Ag, Al, Ta, Ti, W, Sn, Mo, Ni, In, Co, or an alloy of any of them.

* * * * *